United States Patent
Lee et al.

(10) Patent No.: US 11,982,013 B2
(45) Date of Patent: May 14, 2024

(54) RAW MATERIAL FEED HOPPER AND SINGLE CRYSTAL GROWTH SYSTEM

(71) Applicant: SK SILTRON CO., LTD., Gumi-si (KR)

(72) Inventors: Sang Heon Lee, Gumi-si (KR); Chang Youn Lee, Gumi-si (KR); Cheol Hwan Kim, Gumi-si (KR)

(73) Assignee: SK SILTRON CO., LTD., Gumi-si (KR)

( * ) Notice: Subject to any disclaimer, the term of this patent is extended or adjusted under 35 U.S.C. 154(b) by 131 days.

(21) Appl. No.: 17/333,957

(22) Filed: May 28, 2021

(65) Prior Publication Data
US 2022/0228289 A1  Jul. 21, 2022

(30) Foreign Application Priority Data
Jan. 19, 2021  (KR) .......................... 10-2021-0007361

(51) Int. Cl.
*C30B 15/02* (2006.01)
*B65D 88/26* (2006.01)
*C30B 29/06* (2006.01)

(52) U.S. Cl.
CPC .............. *C30B 15/02* (2013.01); *B65D 88/26* (2013.01); *C30B 29/06* (2013.01)

(58) Field of Classification Search
CPC ...... B65D 88/26; B65D 90/626; B65D 90/66; C30B 15/02; C30B 29/06
See application file for complete search history.

(56) References Cited

U.S. PATENT DOCUMENTS

| | | | | |
|---|---|---|---|---|
| 4,007,062 A | * | 2/1977 | Sifferlen | C22C 1/1036 428/614 |
| 5,488,924 A | * | 2/1996 | Horvath | C30B 15/02 117/214 |
| 5,855,232 A | * | 1/1999 | Oda | G01G 13/24 141/83 |
| 2011/0036860 A1 | * | 2/2011 | Fujiwara | C30B 15/02 117/214 |

(Continued)

FOREIGN PATENT DOCUMENTS

| CN | 101135061 A | 3/2008 |
|---|---|---|
| CN | 102534755 A | 7/2012 |
| CN | 104555476 A | 4/2015 |

(Continued)

OTHER PUBLICATIONS

European Patent Office, English computer translation of CN204825120 (Year: 2022).*

(Continued)

*Primary Examiner* — Matthew J Song
(74) *Attorney, Agent, or Firm* — Lewis Roca Rothgerber Christie LLP

(57) ABSTRACT

A raw material feed hopper according to the present embodiment may include a hollow tube having a raw material accommodating space formed therein, a supporter supporting the hollow tube, a cone accommodated in the raw material accommodating space so as to be able to lift up and down, a rod connected to the cone, a connector connected to an upper portion of the rod, a lifting rod connected to the connector, and an elevator installed on the supporter for lifting up and down the lifting rod.

13 Claims, 6 Drawing Sheets

(56) References Cited

U.S. PATENT DOCUMENTS

2013/0305982 A1* 11/2013 Hong ................ H01L 21/02628
                                                                              117/214
2014/0360428 A1* 12/2014 Jang ........................ C30B 15/02
                                                                              117/214

FOREIGN PATENT DOCUMENTS

| CN | 104641024 A | | 5/2015 | |
|---|---|---|---|---|
| CN | 204825120 U | * | 12/2015 | ............ C30B 15/00 |
| CN | 204849114 U | | 12/2015 | |
| CN | 106978623 A | | 7/2017 | |
| CN | 111465723 A | | 7/2020 | |
| CN | 111699286 A | | 9/2020 | |
| JP | 11100091 A | * | 4/1999 | ............ B65D 88/28 |
| JP | 2017-202947 | | 11/2017 | |
| KR | 10-0935083 B1 | | 12/2009 | |
| KR | 10-2018-0013584 A | | 2/2018 | |
| KR | 10-2020-0026247 A | | 3/2020 | |

OTHER PUBLICATIONS

European Patent Office, English computer translation of JP 11-100091 (Year: 2023).*
Korean Office action dated Apr. 21, 2022 issued in corresponding KR Application No. 10- 2021-0007361, 4 pages.
Chinese Office Action for CN Application No. 2023060901944980 dated Jun. 9, 2023, 7 pages.

* cited by examiner

RAW MATERIAL FEED HOPPER AND SINGLE CRYSTAL GROWTH SYSTEM

CROSS-REFERENCE TO RELATED APPLICATIONS

This application claims priority to and the benefit of Korean Patent Application No. 10-2021-0007361, filed on Jan. 19, 2021, the disclosure of which is incorporated herein by reference in its entirety.

TECHNICAL FIELD

The present disclosure relates to a raw material feed hopper and a single crystal growth system capable of supplying a raw material.

BACKGROUND

A single crystal growth apparatus supplies solid polycrystalline silicon into a crucible, then heats the crucible to make a liquid silicon melt, and grows a single crystal ingot having a target diameter by putting a seed that agglomerates a seed crystal in the silicon melt, rotating it, and pulling it up at the same time.

Thus, a solid raw material is supplied to the single crystal growth apparatus before growing the ingot. In a method of supplying the solid raw material according to a shape of the solid raw material, the solid raw material may be supplied by vertically dropping from an upper center of the crucible or obliquely.

An example of a method of supplying a solid raw material is a raw material supply apparatus for single crystal growth disclosed in Korean Laid-Open Patent Publication No. 10-2018-0013584 A (published on Feb. 7, 2018), and in the raw material supply apparatus for single crystal growth, which is mounted on a mounting port of a chamber and additionally supplies solid fuel to a melt contained in a crucible for single crystal growth, the raw material supply apparatus for single crystal growth includes a tube which is hung at the mounting port of the chamber and in which a lower part is infiltrated into the melt of the crucible so as to guide the input of the solid raw material, and a cover provided inside the tube so as to be able to lift up and down and controlling the input of the solid raw material above a surface of the melt of the crucible.

Another example of a method of supplying the solid raw material is a recharge tube disclosed in Korean Laid-open Patent Publication No. 10-2020-0026247 A (published on Mar. 10, 2020).

The recharge tube is a recharge tube including a cylindrical member for accommodating a raw material and a conical valve for opening and closing an opening at a lower portion of the cylindrical member, wherein the cylindrical member has a lower conical opening, which is a conical opening whose inner diameter decreases downward, at a lower end of an inner circumferential surface, and in addition, the cylindrical member has an upper conical opening, which is a conical opening whose inner diameter decreases downward, below the lower conical opening at the lower end, and the valve is positioned between the lower conical opening and the upper conical opening.

SUMMARY

Technical Problem

A raw material supply apparatus for single crystal growth according to the related art has a problem in that dust may be generated in a hollow tube or a cylindrical member when a raw material is supplied into the hollow tube or the cylindrical member.

The present embodiment is directed to providing a raw material supply apparatus and a single crystal growth system in which dust generation may be minimized when a raw material is supplied into a hollow tube.

Technical Solution

In a raw material supply apparatus according to the present embodiment, a raw material feed hopper may include a hollow tube having a raw material accommodating space formed therein, a supporter supporting the hollow tube, a cone accommodated in the raw material accommodating space so as to be able to lift up and down, a rod connected to the cone, a connector connected to an upper portion of the rod, a lifting rod connected to the connector, and an elevator installed on the supporter for lifting up and down the lifting rod.

A gap may be formed between an outer circumference of the cone and an inner circumference of the hollow tube.

The raw material feed hopper may further include a dust stand provided under the supporter and facing a lower portion of the hollow tube and the raw material accommodating space.

The supporter may be provided with a hollow tube support. The hollow tube support may support the hollow tube so that the hollow tube is disposed at an angle that is obliquely laid with respect to the supporter.

The raw material feed hopper may further include a wheel disposed under the supporter.

The elevator may include a cylinder through which the lifting rod is guided.

An example of the elevator may include a driving source installed on the supporter, and a power transmission member connecting the driving source and the lifting rod.

An accommodating hole for accommodating the power transmission member may be formed in the cylinder.

Another example of the elevator may include a pressure regulator that regulates pressure inside the cylinder.

The elevator may lift up the cone to a first height in the hollow tube before the hollow tube is supplied with a raw material.

The first height may be a height closer to an upper end of the upper end and a lower end of the hollow tube.

The elevator may gradually lower a height of the cone while the raw material is supplied into the hollow tube.

The elevator may lift down the cone to a second height in the hollow tube before moving the hollow tube.

The second height may be higher than a lower end of the hollow tube.

The second height may be a height in which the cone is closer to the lower end of a center and the lower end of the hollow tube.

The raw material feed hopper may further include an operation unit for operating the elevator.

A single crystal growth system includes a raw material feed hopper and a single crystal growth apparatus.

The single crystal growth apparatus includes a crucible in which a space for accommodating the raw material dropped from the hollow tube is formed, and a heater for heating the crucible.

The raw material feed hopper may be moved around the single crystal growth apparatus, and may be moved above the crucible together with the hollow tube, cone, rod, and connector and the raw material.

Advantageous Effects

According to an embodiment of the present invention, a cone is lifted up from the inside of a hollow tube, a drop distance of a raw material can be minimized, and the generation of dust due to a drop impact can be minimized.

In addition, since the hollow tube is disposed on a supporter at an obliquely laid angle, the raw material drops along an inner circumference of the hollow tube, and the drop distance can be minimized.

Further, a defective rate of single crystal growth can be minimized by minimizing dust.

Furthermore, the drop distance of the raw material can be minimized, and damage and cracks in the hollow tube due to the impact of the raw material on the hollow tube can be minimized.

In addition, the raw material dropped from the hollow tube drops to a dust stand provided at a lower portion of the supporter, thereby minimizing contamination of a surrounding area, and preventing an accident due to dust.

DETAILED DESCRIPTION OF THE EMBODIMENTS

Hereinafter, the present embodiments will be described in detail with reference to the accompanying drawings.

Figure 1:
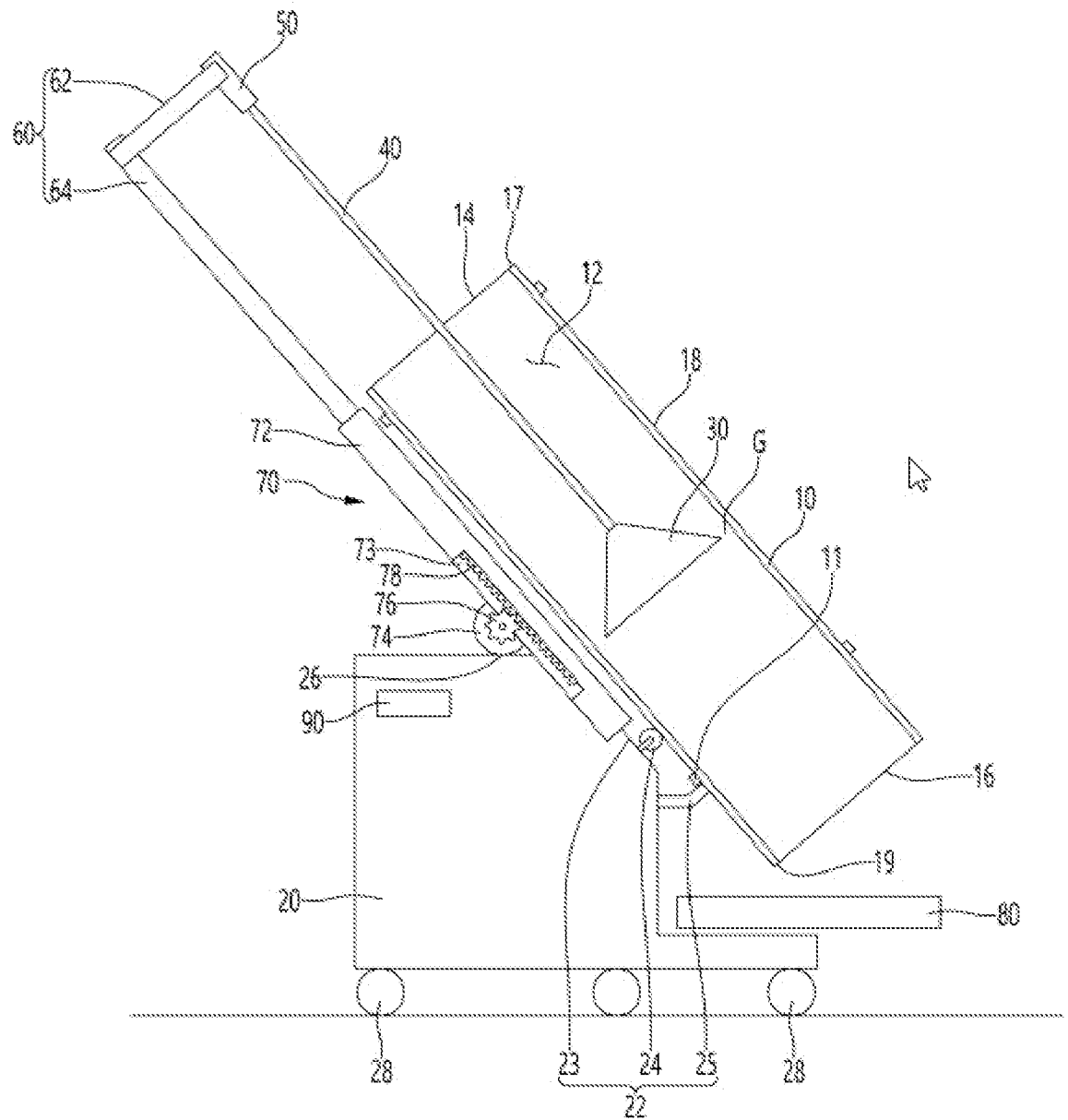
FIG. 1 is a view illustrating a raw material feed hopper according to an embodiment of the present invention.
Figure 2:
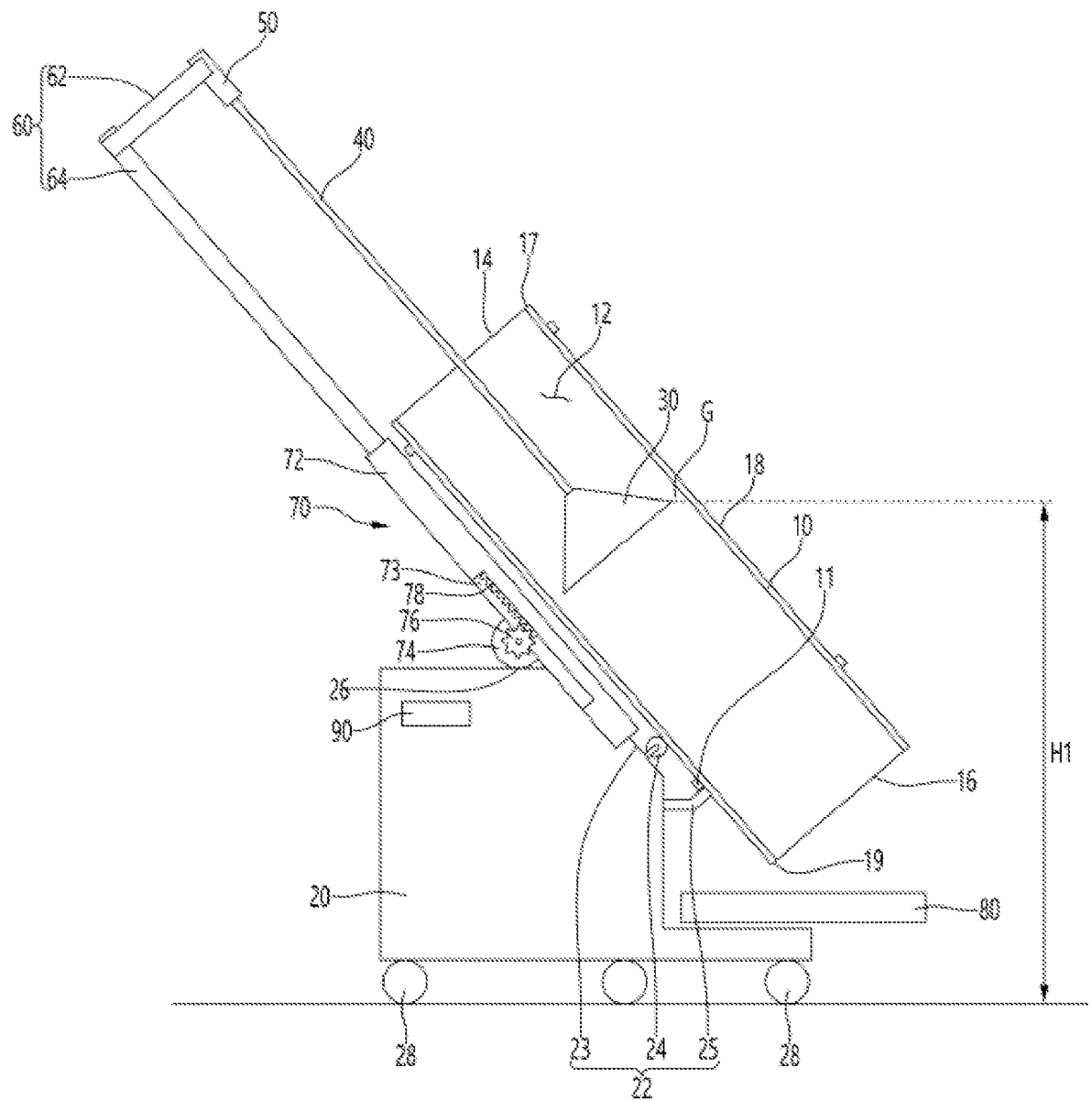
FIG. 2 is a view before the raw material feed hopper shown in FIG. 1 is supplied with a raw material.
Figure 3:
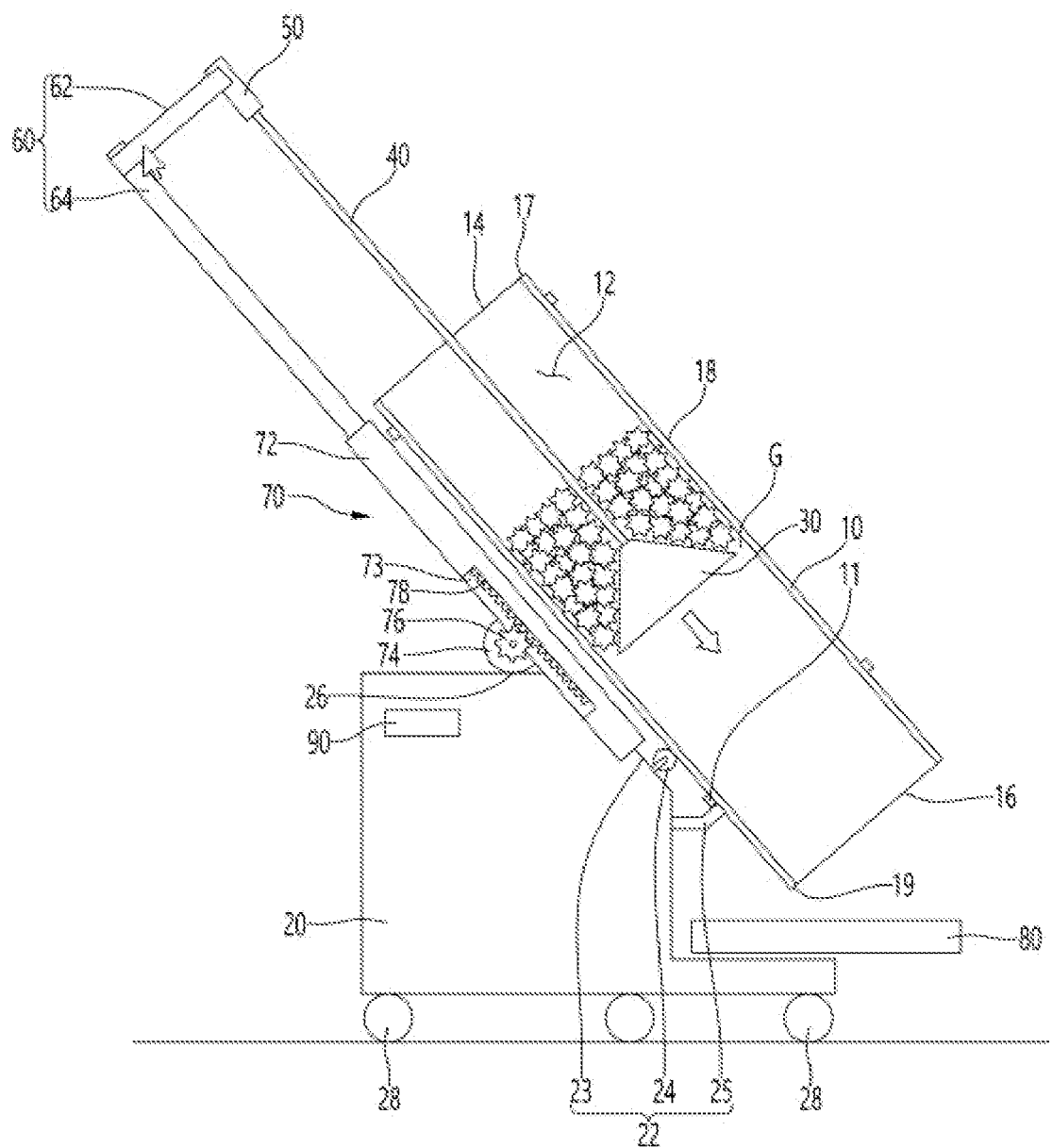
FIG. 3 is a view during the raw material feed hopper shown in FIG. 2 is supplied with the raw material.
Figure 4:
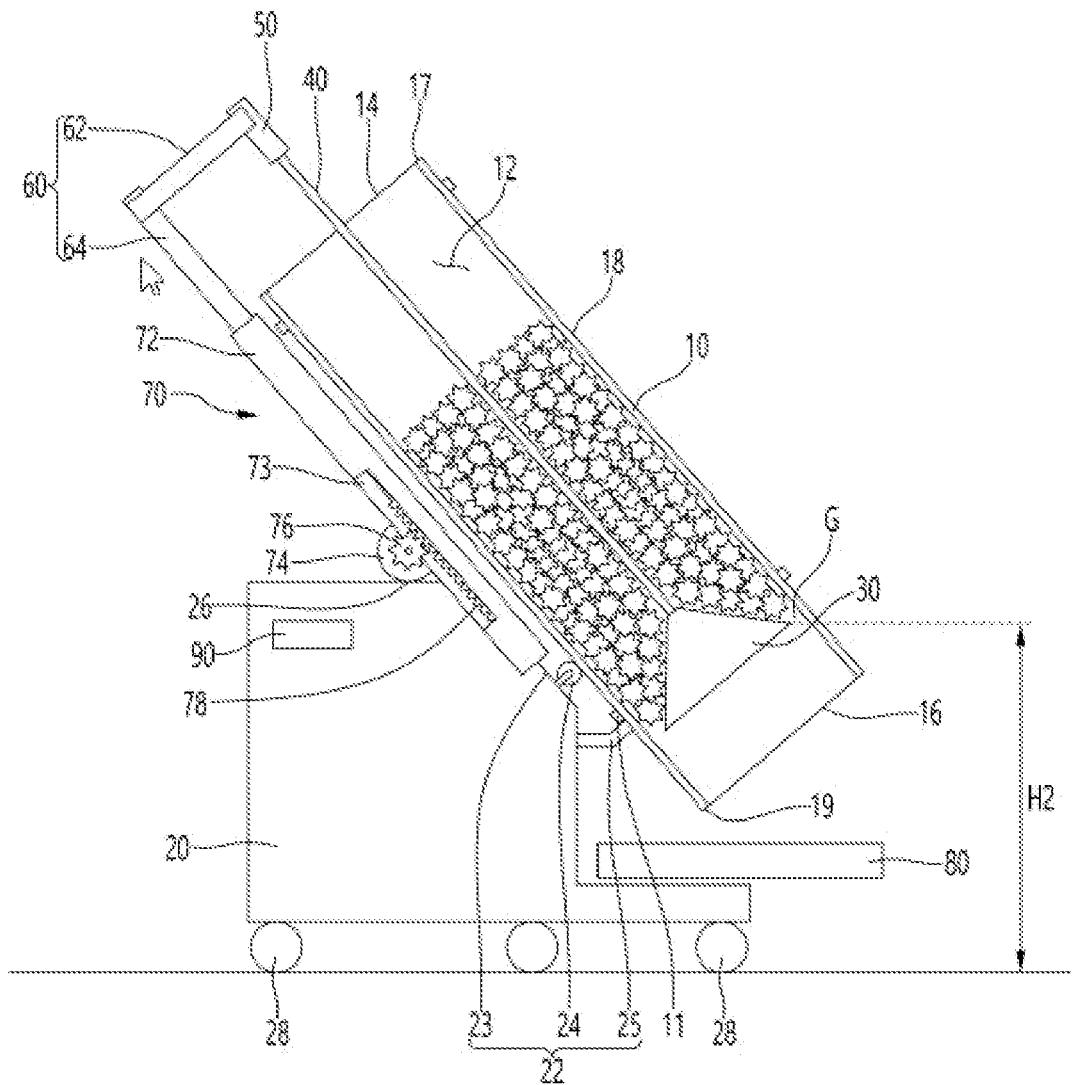
FIG. 4 is a view when the raw material feed hopper shown in FIG. 3 is moved after the raw material is supplied.

FIG. 1 is a view illustrating a raw material feed hopper according to an embodiment of the present invention, FIG. 2 is a view before the raw material feed hopper shown in FIG. 1 is supplied with a raw material, FIG. 3 is a view during the raw material feed hopper shown in FIG. 2 is supplied with the raw material, and FIG. 4 is a view when the raw material feed hopper shown in FIG. 3 is moved after the raw material is supplied.

The raw material feed hopper may include a hollow tube 10, a supporter 20, a cone 30, a rod 40, a connector 50, a lifting rod 60, and an elevator 70.

A raw material accommodating space 12 may be formed in the hollow tube 10. The raw material accommodating space 12 may be formed inside the hollow tube 10, and may be formed long in a longitudinal direction of the hollow tube 10.

A raw material inlet 14 into which the raw material is introduced may be formed at an upper portion of the hollow tube 10. A raw material outlet 16 through which the raw material is discharged may be formed a lower portion of the hollow tube 10.

The raw material inlet 14 may be formed at an upper end 17 of the hollow tube 10, and the raw material outlet 16 may be formed at a lower end 19 of the hollow tube 10.

An example of a raw material supplied to the raw material accommodating space 12 of the hollow tube 10 may be polysilicon that may be introduced into a single crystal growth apparatus 100 (see FIG. 5) to generate an ingot.

The raw material feed hopper may be a polysilicon filler that fills polysilicon into a crucible 110 (see FIG. 5) of the single crystal growth apparatus 100.

The raw material may be introduced into the raw material accommodating space 12 through the raw material inlet 14 of the hollow tube 10 from the outside, and may be temporarily stored by being accommodated in the raw material accommodating space 12 of the hollow tube 10. The raw material may be moved by the hollow tube 10 and the cone 30 in a state of being accommodated in the raw material accommodating space 12.

Figure 6:
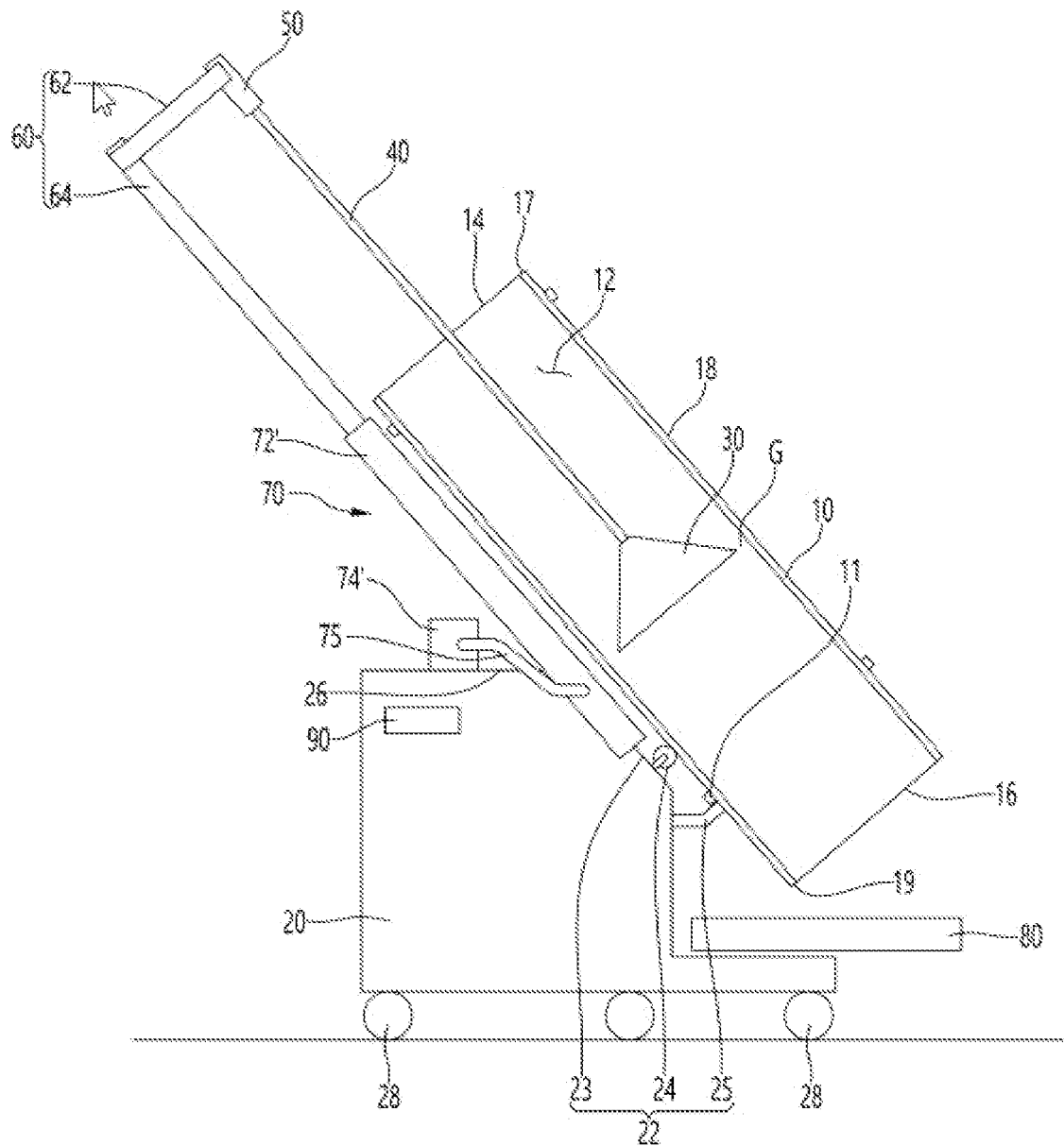
FIG. 6 is a view illustrating a raw material feed hopper according to another embodiment of the present invention.

The raw material accommodated in the raw material accommodating space 12 may drop into the crucible 110 through the raw material outlet 16 when the hollow tube 10 is positioned above the crucible 110 (see FIG. 6).

The supporter 20 may be positioned outside the hollow tube 10.

The supporter 20 may support the hollow tube 10. The hollow tube 10 may be separated from the supporter 20, and may be moved over the crucible 110, and the raw material may be moved onto the crucible 110 in a state of being separated from the supporter 20.

The hollow tube 10 may be moved to a raw material input position together with the cone 30 while being put on the supporter 20. At the raw material input position, the raw material may be introduced into the hollow tube 10.

The hollow tube 10 may be moved near the crucible 110 together with the cone 30, and may be moved above the crucible 110 together with the cone 30. A robot or lifter may lift the hollow tube 10 placed on the supporter 20 near the crucible 110, and may move the hollow tube 10 above the crucible 110 in order to supply raw materials into the crucible 110.

The supporter 20 may be provided with a hollow tube support 22. The hollow tube support 22 may support the hollow tube 10 so that the hollow tube 10 is disposed at an angle that is obliquely laid with respect to the supporter 20.

The hollow tube 10 may be obliquely supported by the supporter 20 so as to have an acute angle of inclination with respect to a horizontal plane.

A raw material feeder (not shown) may introduce the raw material into the hollow tube 10 at the raw material input position. When the hollow tube 10 is at an obliquely laid angle, the raw material dropped from the raw material feeder to the hollow tube 10 does not drop directly to the cone 30, and may drop along an inner circumference of the hollow tube 10.

When the raw material directly drops to the cone 30, dust may be excessive, but when the raw material drops along the inner circumference of the hollow tube 10, a drop distance may be minimized, and generation of dust may be minimized.

The hollow tube support 22 may include an inclined surface 23. The inclined surface 23 may have an inclination angle of an acute angle with respect to the horizontal surface. The inclined surface 23 may be formed at an upper portion of the supporter 20. The inclined surface 23 may be formed to be flat or concave.

The hollow tube support 22 may include at least one roller 24 rotatably disposed on the supporter 20. The roller 24 may be disposed at the upper portion of the supporter 20 to guide the hollow tube 10. The roller 24 may be disposed on the inclined surface 23. The roller 24 may assist the movement of the hollow tube 10 and may support the load of the supporter 22. It is preferable that a plurality of rollers 24 are provided on the supporter 20, and the plurality of rollers 24 may have different heights.

The hollow tube 10 may be placed on the roller 24 when the hollow tube support 22 includes the roller 24, and the hollow tube 10 may be placed and supported on the inclined surface 23 when the hollow tube support 22 does not include the roller 24.

The hollow tube support 22 may further include a stopper 25 for supporting so that the hollow tube 10 does not arbitrarily drop downward.

In an example of the hollow tube 10, a flange 11 may protrude from one side of an outer circumference of the hollow tube 10, and since the flange 11 is hooked on the stopper 25, the hollow tube 10 does not arbitrarily drop downward.

In another example of the hollow tube 10, a separate seating member is disposed under the raw material outlet 16 of the hollow tube 10, and since the seating member is hooked on the stopper 25, the hollow tube 10 does not arbitrarily drop downward.

An elevator mounting part 26 on which the elevator 70 is mounted may be formed on the supporter 20. A driving source 74 of the elevator 70 may be mounted on the elevator mounting part 26. The elevator mounting part 26 may be formed at the upper portion of the supporter 20.

The raw material feed hopper may further include a wheel 28 disposed under the supporter 20. When the raw material feed hopper further includes the wheel 28, the raw material feed hopper may be moved as a whole together with a cart or the like, and the raw material feed hopper may be a cart-type raw material feed hopper or a raw material feed cart.

The cone 30 may be accommodated in the raw material accommodating space 12 to be lifting up and down. The cone 30 may be a cover blocking the raw material accommodating space 12.

A gap G may be formed between an outer circumference of the cone 30 and the inner circumference of the hollow tube 10. The cone 30 may be easily lifted up and down inside the hollow tube 10. The gap G may be approximately 5 mm.

The rod 40 may be connected to the cone 30. The lower portion of the rod 40 may be connected to the cone 30. A part of the rod 40 may be positioned in the raw material accommodating space 12, and may be lifted up and down by the connector 50 to adjust a height of the cone 30.

The rod 40 may be moved together with the hollow tube 10 when the hollow tube 10 is moved over the crucible 110.

The connector 50 may be connected to an upper portion of the rod 40. The connector 50 may be detachably connected to the lifting rod 60. When the connector 50 is connected to the lifting rod 60, the lifting rod 60 may lift up and down the connector 50.

The connector 50 may be separated from the lifting rod 60, and when the hollow tube 10 is moved to the crucible 110, the connector 50 may be moved together with the hollow tube 10. The connector 50 may function as a hook member on which a robot or a lifter's hand is hooked.

The lifting rod 60 may be connected to the connector 50. The lifting rod 60 may be connected to the connector 50 outside the hollow tube 10.

The lifting rod 60 may include a connector connecting part 62 to which the connector 50 is detachably connected.

The lifting rod 60 may include a rod part 64 connected to the connector connecting part 62.

The connector connecting part 62 and the rod part 64 may be lifted up and down outside the hollow tube 10.

The connector connecting part 62 and the rod part 64 may be orthogonal to each other.

The rod part 64 may be parallel to the hollow tube 10 outside the hollow tube 10.

The lifting rod 60 may remain in the supporter 20 together with the elevator 70 when the hollow tube 10 is moved over the crucible 110.

The elevator 70 may adjust a height of the lifting rod 60 to adjust heights of the connector 50, the rod 40, and the cone 30. That is, the elevator 70 may be a cone height adjusting mechanism.

The elevator 70 may be installed on the supporter 20, and may lift up and down the lifting rod 60 next to the hollow tube 10. The elevator 70 may be mounted on the elevator mounting part 26 of the supporter 20, and may remain in the supporter 20 when the hollow tube 10 is moved over the crucible 110.

The elevator 70 may include a cylinder 72 through which the lifting rod 60 is guided.

A part of the lifting rod 60 may be disposed inside the cylinder 72. A part of the rod part 64 may be disposed inside the cylinder 72

An example of the elevator 70 may include the driving source 74 installed on the supporter 20 and power transmission members 76 and 78 that transmits the driving force of the driving source 74 to the lifting rod 60.

The driving source 74 may be mounted on the elevator mounting part 26.

The power transmission members 76 and 78 may connect the driving source 76 and the lifting rod 60.

An example of the driving source 74 may be a motor in which a rotational shaft is rotated. When the driving source 74 is a motor, an example of the power transmission members 76 and 78 may include a gear. The power transmission members 76 and 78 may include a pinion 76 connected to the rotational shaft of the motor, and a rack 78 provided on the lifting rod 60, in particular, the rod part 64.

Another example of the driving source 74 may be a linear motor. When the driving source 74 is the linear motor, an example of the power transmission members 76 and 78 may include a linear guide.

An accommodating hole 73 for accommodating the power transmission members 76 and 78 may be formed in the cylinder 72.

The driving source 74 may be operated to lift up and down the rod part 64 positioned in the cylinder 72 in a state of being disposed outside the cylinder 72.

Before the hollow tube 10 is supplied with the raw material, the elevator 70 may raise the cone 30 to a first height H1 in the hollow tube 10 as shown in FIG. 2.

The first height H1 may be a height closer to the upper end 17 of the upper end 17 and the lower end 19 of the hollow tube 10.

The cone 30 may receive the raw material supplied to the raw material inlet 14 of the hollow tube 10 while being raised to the first height H1 by the elevator 70. The raw material supplied to the raw material inlet 14 does not have a large drop because the height of the cone 30 is high, damage and breakage of the raw material may be minimized, and an original shape of the raw material may be maintained as much as possible.

While the raw material is supplied to the hollow tube 10, the elevator 70 may gradually lower the height of the cone

30, as shown in FIG. 3. As an amount of the raw material supplied to the raw material inlet 14 increases, the height of the cone 30 may be lowered so that a sufficient space may be secured inside the cone 30.

A height of an upper end of the raw material in the hollow tube 10 may be high, and the raw material newly supplied to the raw material inlet 14 does not have a large drop because the height of the upper end of the raw material in the hollow tube 10 is high, and may be gradually stacked in the hollow tube 10.

As described above, when the height of the cone 30 is gradually lowered, damage and breakage of the raw material may be minimized, and the original shape of the raw material may be maintained as much as possible.

The elevator 70 may move down the cone 30 to a second height H2 in the hollow tube 10 as shown in FIG. 4 before moving the hollow tube 10. That is, after the cone 30 is moved down to the second height H2 in the hollow tube 10, the raw material feed hopper, in particular, the supporter 20 may move the hollow tube 10.

The second height H2 may be higher than the lower end 19 of the hollow tube 10. The second height H2 may be a height at which the raw material in the hollow tube 10 does not arbitrarily drop into the raw material outlet 16 and is stored in the hollow tube 10.

The second height H1 may be a height in which the cone 30 is closer to the lower end 19 of the center 18 and the lower end 19 of the hollow tube 10.

The raw material feed hopper may further include a dust stand 80. Dust separated from the raw material together with the raw material may be accommodated inside the hollow tube 10, and the dust passes through the gap G between the outer circumference of the cone 30 and the inner circumference of the hollow tube 10, and then may drop into the raw material outlet 16.

The dust stand 80 may be provided at a position capable of receiving the dust dropped to the raw material outlet 16.

The dust stand 80 may be provided the lower portion of the supporter 20, and may face a lower portion of the hollow tube 10 and the raw material accommodating space 12. The dust stand 80 may have an open upper surface, and a dust accommodating space may be formed therein.

The raw material feed hopper may further include an operation unit 90 for operating the elevator 70. The operation unit 90 may include a button through which an operator may input an operation command, a stop command, an ascending command, a descending command, and the like.

The operation unit 90 may be provided to the supporter 20 or may be connected to the supporter 20 by an electric wire. The operation unit 90 may be a remote controller separated from the supporter 20.

As shown in FIG. 4, in a state in which the cone 30 is moved down to the second height H2 in the hollow tube 10, the raw material feed hopper may be moved around the single crystal growth apparatus 100.

When the raw material feed hopper is moved around the single crystal growth apparatus 100, the robot or lifter may lift the hollow tube 10 and the connector 50 and move them onto the crucible 110, and the hollow tube 10, the cone 30, the rod 40, and the connector 50 and the raw material may be moved onto the crucible 110.

Figure 5:
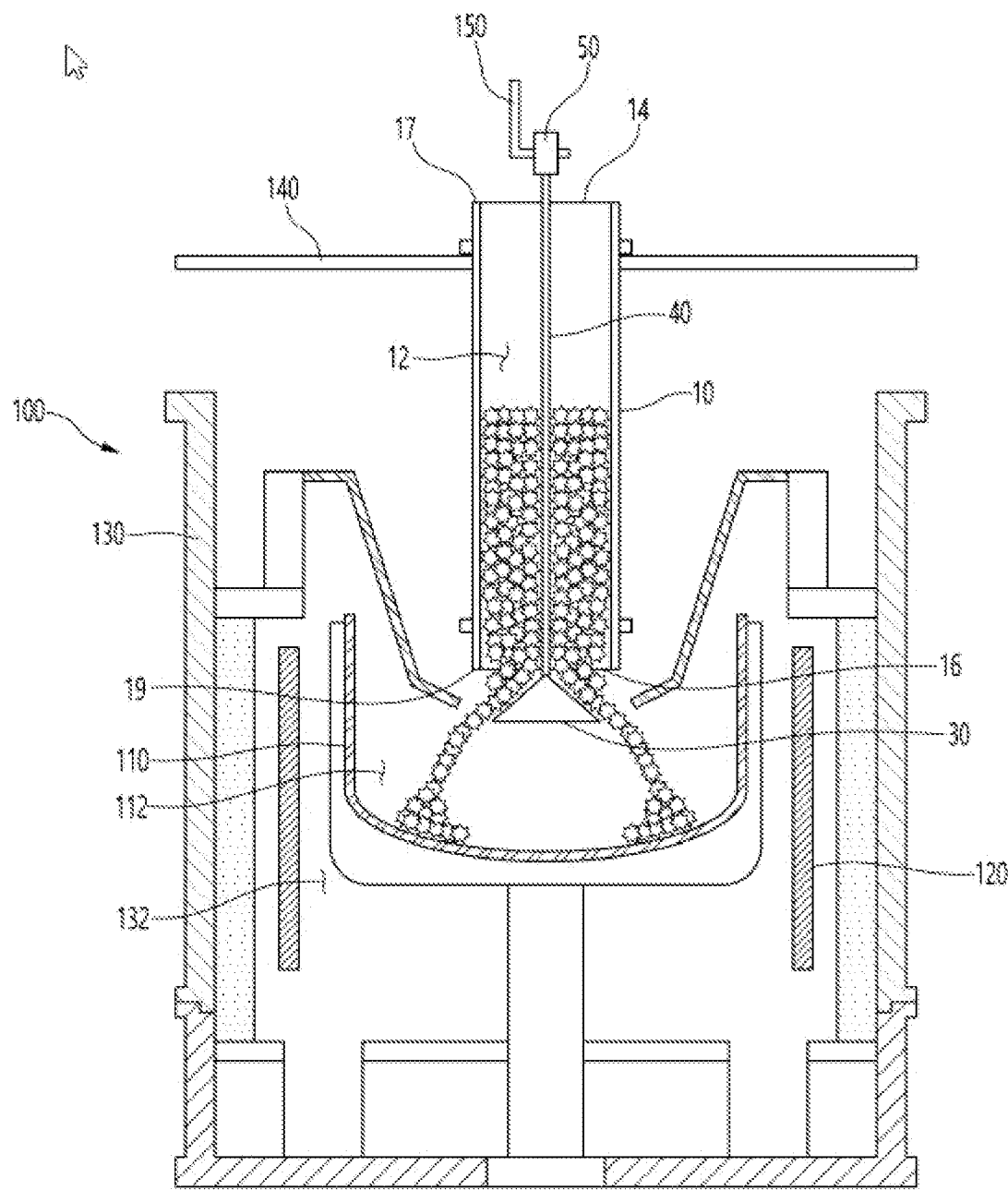
FIG. 5 is a view when the hollow tube shown in FIG. 4 supplies the raw material into the crucible.

FIG. 5 is a view when the hollow tube shown in FIG. 4 supplies the raw material into the crucible.

The raw material feed hopper may be moved around the single crystal growth apparatus 100. The single crystal growth apparatus 100 may form the single crystal growth system together with the raw material feed hopper.

The single crystal growth apparatus 100 may include the crucible 110 that receives the raw material through the hollow tube 10 and a heater 120 that heats the crucible 110.

A space 112 in which the raw material dropped from the hollow tube 10 is accommodated may be formed inside the crucible 110.

The single crystal growth apparatus may include a chamber 130. The chamber 130 may have a space 132 in which the crucible 110 and the heater 120 are accommodated.

An example of the crucible 110 may be a quartz crucible, and the raw material may be heated inside the crucible 110 after dropping into the crucible 110 from the hollow tube 10.

The heater 120 may heat the crucible 110 from the outside of the crucible 110. The heater 120 may be disposed between the crucible 110 and the chamber 130.

The single crystal growth apparatus may include a frame 140 disposed above the crucible 110 and on which the hollow tube 10 is seated. The single crystal growth apparatus may further include a hollow tube lifting mechanism for lifting the hollow tube 10.

The single crystal growth apparatus may further include a connector holder 150 to which the connector 50 may be suspended.

The single crystal growth apparatus may include a connector holder lifting mechanism for lifting the connector holder 150.

After the hollow tube 10, the cone 30, the rod 40, the connector 50, and the raw material are moved above the crucible 110, the single crystal growth apparatus may raise the hollow tube 10 or lower the connector 50 to position the cone 30 below a lower end of the raw material outlet 16. That is, all the raw material outlets 16 may be opened.

The raw material in the hollow tube 10 does drop into the space 112 of the crucible 110 through the gap between the raw material outlet 16 and the cone 30 as the cone 30 is positioned below the raw material outlet 16.

FIG. 6 is a view illustrating a raw material feed hopper according to another embodiment of the present invention.

The raw material feed hopper of the embodiment may include an elevator 70' for elevating the lifting rod 60, as shown in FIG. 6, and the elevator 70' may include a cylinder 72' through which the lifting rod 60 is guided and a pressure regulator 74' for controlling pressure inside the cylinder 72'.

The pressure regulator 74' may be a hydraulic regulator that regulates hydraulic pressure inside the cylinder 72' or a pneumatic regulator that regulates air pressure inside the cylinder 72'.

The pressure regulator 74' may be connected to the cylinder 72' and the tube 75, and the cylinder 72' and the pressure regulator 74' are hydraulic cylinders or pneumatics capable of adjusting the height of the lifting rod 60.

In the embodiment, a configuration and operation of the tube 10, the supporter 20, the cone 30, the rod 40, the connector 50, and the lifting rod 60 other than the elevator 70' are the same as or similar to the raw material feed hopper of one embodiment of the present invention, and thus, the same reference numerals are used, and detailed descriptions thereof are omitted in order to avoid redundant descriptions.

The above-described descriptions are merely illustrative of the technological spirit of the present invention, and various modifications and variations may be made by those having ordinary skill in the art to which the present invention pertains without departing from the essential characteristics of the present invention.

Therefore, the embodiments disclosed in the present invention are not intended to limit the technological spirit of the present invention, but the embodiments are intended to describe, and the spirit and scope of the present invention is not limited by such embodiments.

The protection scope of the present invention should be construed by the following claims, and all technological spirits within the equivalent scope thereof should be construed as being included in the scope of right of the present invention.

What is claimed is:

1. A raw material feed hopper comprising:
   a hollow tube having a raw material accommodating space formed therein;
   a supporter supporting the hollow tube;
   a cone accommodated in the raw material accommodating space so as to be able to lift up and down;
   a rod connected to the cone;
   a connector connected to an upper portion of the rod;
   a lifting rod connected to the connector, wherein the lifting rod is located outside of the hollow tube; and
   an elevator installed on the supporter for lifting up and down the lifting rod,
   wherein the elevator is configured to lift up the cone to a first height in the hollow tube before the hollow tube is supplied with a raw material, and
   wherein the first height is a height closer to an upper end of the hollow tube than to a lower end of the hollow tube,
   wherein the elevator gradually lowers a height of the cone while the raw material is supplied into the hollow tube,
   wherein the supporter is provided with a hollow tube support for supporting the hollow tube so that the hollow tube is disposed at an angle that is obliquely laid with respect to the supporter, and
   wherein the hollow tube support comprises
      an inclined surface formed at an upper portion of the supporter, and
      at least one roller on the inclined surface to guide the hollow tube.

2. The raw material feed hopper of claim 1, wherein a gap is formed between an outer circumference of the cone and an inner circumference of the hollow tube.

3. The raw material feed hopper of claim 2, further comprising a dust stand provided under the supporter and facing a lower portion of the hollow tube and the raw material accommodating space.

4. The raw material feed hopper of claim 1, further comprising a wheel disposed under the supporter.

5. The raw material feed hopper of claim 1, wherein the elevator includes a cylinder through which the lifting rod is guided.

6. The raw material feed hopper of claim 5, wherein the elevator includes a driving source installed on the supporter, and a power transmission member connecting the driving source and the lifting rod.

7. The raw material feed hopper of claim 6, wherein an accommodating hole for accommodating the power transmission member is formed in the cylinder.

8. The raw material feed hopper of claim 5, further comprising a pressure regulator that regulates pressure inside the cylinder.

9. The raw material feed hopper of claim 1, wherein the elevator lifts down the cone to a second height in the hollow tube before moving the hollow tube.

10. The raw material feed hopper of claim 9, wherein the second height is higher than a lower end of the hollow tube, and is a height in which the cone is closer to the lower end of a center and the lower end of the hollow tube.

11. The raw material feed hopper of claim 1, further comprising
    an operation unit for operating the elevator.

12. A single crystal growth system comprising:
    a raw material feed hopper including a hollow tube having a raw material accommodating space formed therein, a supporter supporting the hollow tube, a cone accommodated in the raw material accommodating space so as to be able to lift up and down, a rod connected to the cone, a connector connected to an upper portion of the rod, a lifting rod connected to the connector, and an elevator installed on the supporter for lifting up and down the lifting rod; and
    a single crystal growth apparatus including a crucible in which a space for accommodating a raw material dropped from the hollow tube is formed, and a heater for heating the crucible,
    wherein the raw material feed hopper is moved around the single crystal growth apparatus, and is moved above the crucible together with the hollow tube, cone, rod, and connector and the raw material,
    wherein the lifting rod is located outside of the hollow tube,
    wherein the elevator lifts up the cone to a first height in the hollow tube before the hollow tube is supplied with the raw material,
    wherein the first height is a height closer to an upper end of the hollow tube than to a lower end of the hollow tube,
    wherein the elevator gradually lowers a height of the cone while the raw material is supplied into the hollow tube,
    wherein the supporter is provided with a hollow tube support for supporting the hollow tube so that the hollow tube is disposed at an angle that is obliquely laid with respect to the supporter, and
    wherein the hollow tube support comprises
       an inclined surface formed at an upper portion of the supporter, and
       at least one roller on the inclined surface to guide the hollow tube.

13. The single crystal growth system of claim 12, further comprising:
    a dust stand provided under the supporter and facing a lower portion of the hollow tube and the raw material accommodating space, and
    a wheel disposed under the supporter.

* * * * *